United States Patent [19]
Hall et al.

[11] Patent Number: 6,104,253
[45] Date of Patent: Aug. 15, 2000

[54] INTEGRATED CIRCUITS HAVING COOPERATIVE RING OSCILLATOR CLOCK CIRCUITS THEREIN TO MINIMIZE CLOCK SKEW

[75] Inventors: Lester Crossman Hall; S Mark Clements, both of Raleigh; Wentai Liu, Cary; Griff L. Bilbro, Raleigh, all of N.C.

[73] Assignee: North Carolina State University, Raleigh, N.C.

[21] Appl. No.: 08/989,294

[22] Filed: Dec. 11, 1997

Related U.S. Application Data

[63] Continuation of application No. 08/859,976, May 21, 1997, abandoned.

[51] Int. Cl.$^7$ .............................. H03B 5/02; H03B 27/00; H03K 3/03
[52] U.S. Cl. ............................ 331/56; 327/294; 327/565; 331/45; 331/57; 331/74
[58] Field of Search ................................. 331/45, 46, 56, 331/57, 74; 327/294, 295, 565

[56] References Cited

U.S. PATENT DOCUMENTS

| 5,163,068 | 11/1992 | El-Amawy | 375/107 |
| 5,475,344 | 12/1995 | Maneatis et al. | 331/57 |

OTHER PUBLICATIONS

Friedman, *Clocking Arbitrarily Large Computing Structures Under Constant Skew Bound*, Clock Distribution Networks In VLSI Circuits And Systems, A Selected Reprint Volume IEEE Circuits and Systems Society, IEEE Press, 1995, ISBN 0–7803–1058–6, IEEE Order No.: PC4127, pp. 463–477.

Galton et al., *Clock Distribution Using Coupled Oscillators*, 1996 IEEE International Symposium On Circuits And Systems, vol. 3, ISCAS 96, May 12–15 1996, pp. 217–220.

Montanaro et al., A 160–MHz, 32–b, 0.5–W CMOS RISC Microprocessor, IEEE Journal of Solid–State Circuits, vol. 31, No. 11, Nov. 1996, pp. 1703–1714.

Lee et al., A Novel High–Speed Ring Oscillator For Multiphase Clock Generation Using Negative Skewed Delay Scheme, IEEE Journal of Solid–State Circuits, vol. 32, No. 2, Feb. 1997, pp. 289–291.

(List continued on next page.)

*Primary Examiner*—Siegfried H. Grimm
*Attorney, Agent, or Firm*—Myers Bigel Sibley & Sajovec

[57] ABSTRACT

Integrated circuits having cooperative ring oscillator clock circuits therein include a plurality of synchronous and asynchronous active devices on the substrate and a plurality of "cooperative" ring oscillators (CRO) electrically coupled in parallel at respective clock nodes, interspersed on the substrate as a mesh, for example. The ring oscillators, which may have a predetermined number of stages but possibly different size in terms of clock driving capability, are preferably interspersed among the synchronous active devices on the surface of the substrate to provide a "local" clock signal which is constrained in terms of skew and jitter by the presence of the other parallel-connected ring oscillators at other locations on the substrate. Multiple replications of a ring-oscillator containing three serially connected inverters may result in the formation of a two-dimensional hexagonal network of clock nodes of different phases (e.g., $\phi_1$, $\phi_2$ and $\phi_3$). Connection of the inverters as a hexagonal network also causes "aggregation" because the arrangement of the inverters in the net places the inverters in parallel. Whenever inverters are connected in parallel, an "aggregated" inverter is formed having an effective width equal to the arithmetic sum of the widths of the all the individual inverters of the same phase. This "aggregation" compensates for process variations because the "faster" and "slower" inverters tend to cancel each other out during signal transitions. The benefits of aggregation are also independent of the size of the IC so efficient scaling can be readily achieved. Ring oscillators of larger size (e.g., widths) can also be placed in close proximity to those portions of the circuit which have high load synchronous active devices therein, to inhibit local variations in skew and jitter.

13 Claims, 4 Drawing Sheets

OTHER PUBLICATIONS

Christiansen, An Integrated High Resolution CMOS Timing Generator Based On An Array Of Delay Locked Loops, IEEE Journal of Solid–State Circuits, vol. 31, No. 7, Jul. 1996, pp. 952–957.

Gaddis et al., A 64–b Quad–Issue CMOS RISC Microprocessor, IEEE Journal of Solid–State Circuits, vol. 31, No. 11, Nov. 1996, pp. 1697–1702.

Dobberpuhl et al., A 200–MHz 64–b Dual–Issue CMOS Microprocessor, IEEE Journal of Solid–State Circuits, vol. 27, No. 11, Nov. 1992, pp. 1555–1564.

Gronowski, et al., A 433–MHz 64–b Quad–Issue RISC Microprocessor, IEEE Journal of Solid–State Circuits, vol. 31, No. 11, Nov. 1996, pp. 1687–1696.

Bowhill et al., Circuit Implementation of a 300–MHz 64–bit Second–generation CMOS Alpha CPU, Digital Technical Journal, vol. 7, No. 1, 1995, pp. 100–114.

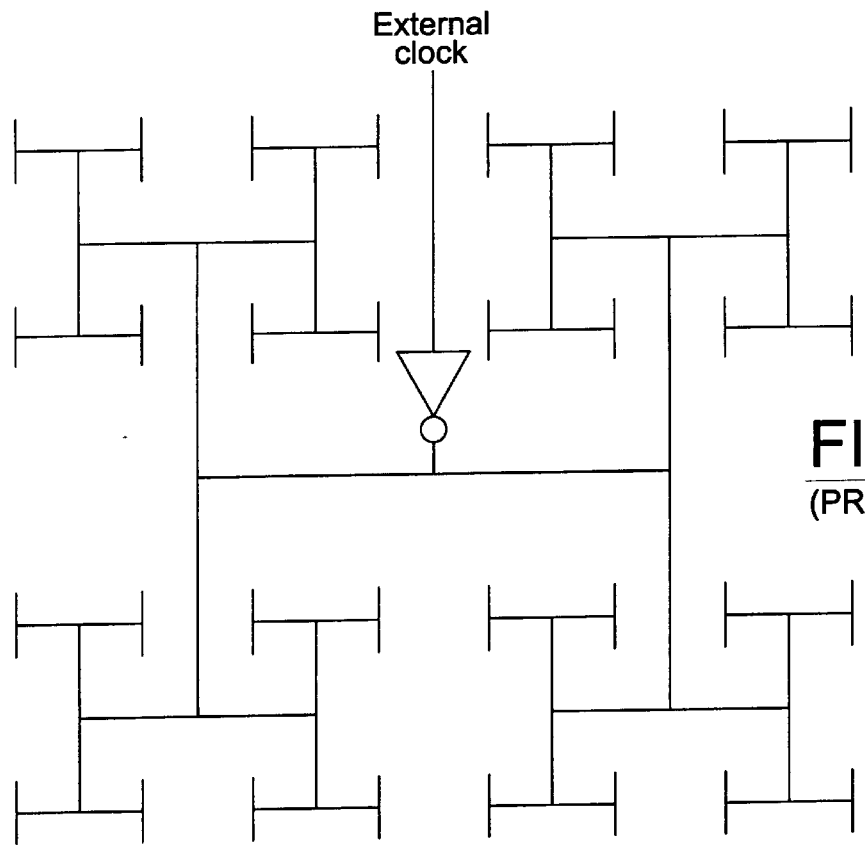
FIG. 1.
(PRIOR ART)
FIG. 2A.
(PRIOR ART)
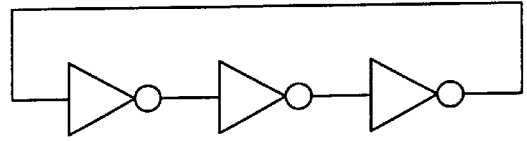
FIG. 2B.
(PRIOR ART)
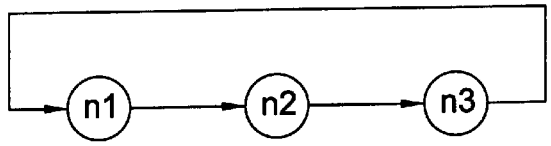
FIG. 2C.
(PRIOR ART)
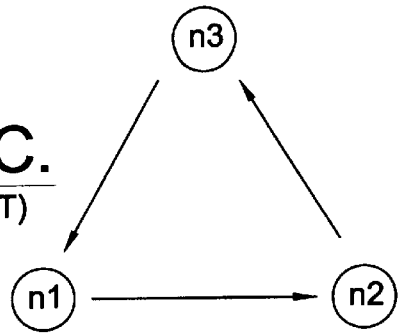

INTEGRATED CIRCUITS HAVING COOPERATIVE RING OSCILLATOR CLOCK CIRCUITS THEREIN TO MINIMIZE CLOCK SKEW

This application is a continuation of Ser. No. 08/859,976, filed May 21, 1997 and now abandoned.

FIELD OF THE INVENTION

The present invention relates to circuits, and more particularly to circuits containing active devices therein and clock circuits therein for synchronizing the operation of the active devices.

BACKGROUND OF THE INVENTION

Clock distribution technology is currently a hot topic in the microprocessor design industry because microprocessor performance is typically limited by the accuracy and frequency of the clock signal. Any error in jitter or skew of the clock signal must be compensated for by increasing the clock period, however, increases in clock period typically reduce microprocessor operating frequency and performance. Accordingly, accurate clocking circuits are desirable.

With the widely used H-tree clock distribution network illustrated by FIG. 1, clock skew can be minimized by carefully matching the wiring delays across an integrated circuit (IC). However, H-tree clock distribution networks are typically limited to only a single clock phase. Novel clock circuit structures designed to further improve microprocessor clocking are continually emerging, but thus far circuits that incorporate both multiphase signal generation and efficient distribution have yet to be satisfactorily developed. It is advantageous to utilize multiphase clocks in many designs because clock cycle time can be reduced by breaking up critical paths into smaller delays with greater latency. Also, the availability of multiple phases aids creative circuit designers in producing faster logic circuits and latches. Another disadvantage of feed-forward clock distribution circuits such as the binary H-tree network of FIG. 1 is that clock skew increases with chip size. As chip sizes increase, the wiring delay and the number of synchronous active devices (e.g., latches) increase and result in greater load capacitance and correspondingly higher clock skew.

Thus, clocking circuits are needed which are more suitable for large integrated circuit chips and provide reduced clock skew and jitter. Moreover, clocking circuits are needed which provide for the efficient generation and distribution of multiphase clock signals to synchronous active devices on an integrated circuit chip.

SUMMARY OF THE INVENTION

It is therefore an object of the present invention to provide improved clocking circuits for integrated circuits containing synchronous active devices therein.

It is another object of the present invention to provide clocking circuits which are capable of generating clock signals having multiple phases.

It is still another object of the present invention to provide clocking circuits which can be readily and efficiently scaled upward with increases in integrated circuit chip size.

It is still a further object of the present invention to provide clocking circuits in which the synthesis and distribution can be combined.

These and other objects, advantages and features of the present invention are provided by integrated circuits which comprise a substrate, a plurality of synchronous and asynchronous active devices on the substrate and a plurality of "cooperative" ring oscillators (CRO) electrically coupled in parallel at respective clock nodes, interspersed on the substrate as a mesh, for example. Preferably, the ring oscillators, which may have a predetermined number of stages but possibly different size in terms of clock driving capability, are interspersed among the synchronous active devices on the surface of the substrate to provide a "local" clock signal which is constrained in terms of skew and jitter by the presence of the other parallel-connected ring oscillators at other locations on the substrate.

According to one embodiment of the present invention, multiple replications of a ring-oscillator containing three serially connected inverters may result in the formation of a two-dimensional hexagonal network (hexnet) of clock nodes of different phases (e.g., $\phi_1$, $\phi_2$ and $\phi_3$). Connection of the inverters as a hexagonal network also causes "aggregation" because the arrangement of the inverters in the net places each inverter stage in parallel with other inverters of the same phase. In particular, whenever inverters are connected in parallel, an "aggregated" inverter is formed having an effective width equal to the arithmetic sum of the widths of all the individual inverters of the same phase. This "aggregation" compensates for process variations because the "faster" and "slower" inverters tend to cancel each other out during signal transitions and because transistor size variations are averaged. The benefits achieved by aggregation are also independent of the size of the IC so efficient scaling is possible. Ring oscillators of larger size (e.g., widths) can also be placed in close proximity to those portions of the circuit which have "high load" synchronous active devices therein, to inhibit local variations in skew and jitter.

BRIEF DESCRIPTION OF THE DRAWINGS

FIG. 1 is a layout schematic of a binary H-tree clock distribution system according to the prior art.

FIGS. 2A–2C are electrical and symbolic schematics of a three-stage ring oscillator, according to the prior art.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring now to FIG. 2A, an electrical schematic of a three-stage ring oscillator is illustrated as an exemplary unit cell clock generator. As will be understood by those skilled in the art, the frequency of the clock signal generated at any of the three clock nodes (i.e., outputs of the inverters) is a function of, among other things, the inverter stage delay and the number of inverters in the ring. In addition, other ring oscillators, such as differential ring oscillators, may also be substituted for the illustrated unit cell clock generator of FIG. 2A, and cooperative ring oscillator (CRO) described more fully hereinbelow with respect to FIG. 5. Referring now to FIGS. 2B–2C, symbolic schematic diagrams of the ring oscillator of FIG. 2A are illustrated. By illustrating a three-stage ring oscillator in this manner, the simplest CRO cell can be both physically and electrically represented. Here, the diagonal lines may be implemented orthogonally in Manhatten architecture with no skew penalty by varying the spacing of the CRO array.

Figure 3:
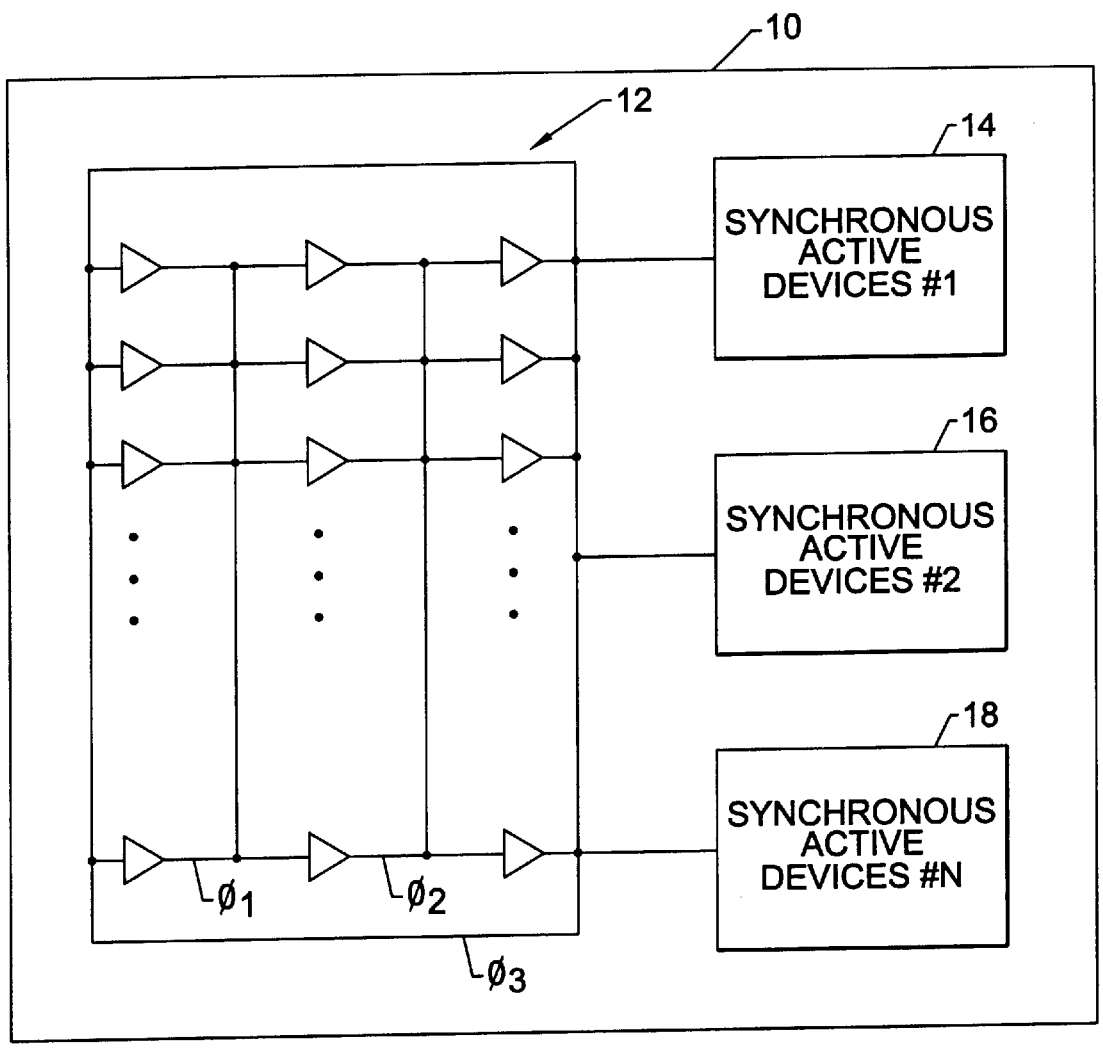
FIG. 3 is a block schematic diagram of an integrated circuit having a single phase clock, according to a first embodiment of the present invention.

Referring now to FIG. 3, a block schematic diagram of an integrated circuit 10 having a single phase clock ($\phi_3$), according to a first embodiment of the present invention, is illustrated. Here, a plurality of groups of interspersed synchronous active devices 14–18 and a plurality of asynchronous active devices are preferably provided on an integrated circuit substrate (e.g., silicon chip). According to a preferred aspect of the present invention, a plurality of "cooperative" ring oscillators (CRO) 12 are also provided. As illustrated, the ring oscillators are electrically coupled in parallel at respective clock nodes ($\phi_1$, $\phi_2$ and $\phi_3$). These ring oscillators may be interspersed on the substrate as a mesh, for example, as more fully described hereinbelow with respect to FIG. 5. For purposes of illustration only, electrical models (e.g., RC networks, transmission lines, etc.) of the interconnect lines are omitted. Accordingly, the ring oscillators, which may have a predetermined number of stages but possibly different size in terms of clock driving capability, are preferably interspersed among the synchronous active devices on the surface of the substrate to provide a "local" clock signal which is constrained in terms of skew and jitter by the presence of the other parallel-connected ring oscillators at other locations on the substrate.

Figure 4:
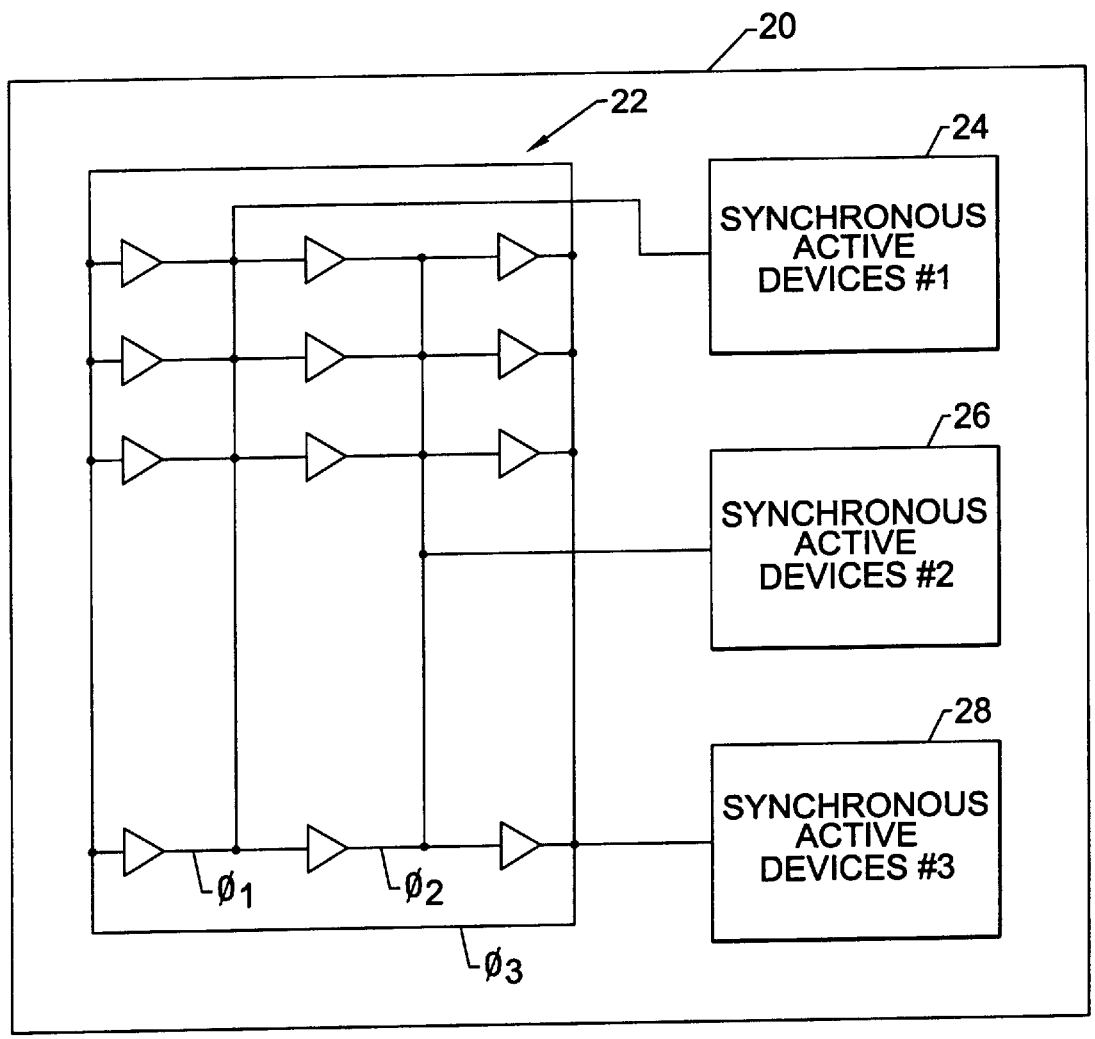
FIG. 4 is a block schematic diagram of an integrated circuit having a three-phase clock, according to a second embodiment of the present invention.

Referring now to FIG. 4, a block schematic diagram of an integrated circuit 20 having a three phase clock ($\phi_1$–$\phi_3$), according to a second embodiment of the present invention, is illustrated. Here, a plurality of groups of synchronous active devices 24–28 and a plurality of asynchronous active devices are preferably provided on an integrated circuit substrate (e.g., silicon chip). Each of the synchronous active devices in respective groups (#1–#3) may be interspersed on the substrate with the other synchronous and asynchronous active devices. A plurality of "cooperative" ring oscillators (CRO) 22 are provided. These ring oscillators are electrically coupled in parallel at respective clock nodes ($\phi_1$, $\phi_2$ and $\phi_3$). These ring oscillators may be interspersed on the substrate as a mesh, as more fully described below with respect to FIG. 5. The ring oscillators, which may have a predetermined number of stages but possibly different size in terms of clock driving capability, are preferably interspersed among the synchronous active devices on the surface of the substrate to provide a "local" clock signal which is constrained in terms of skew and jitter by the presence of the other parallel-connected ring oscillators at other locations on the substrate. The above schematic diagrams of FIGS. 3 and 4 may also be applied to printed circuit boards containing the illustrated devices.

Figure 5:
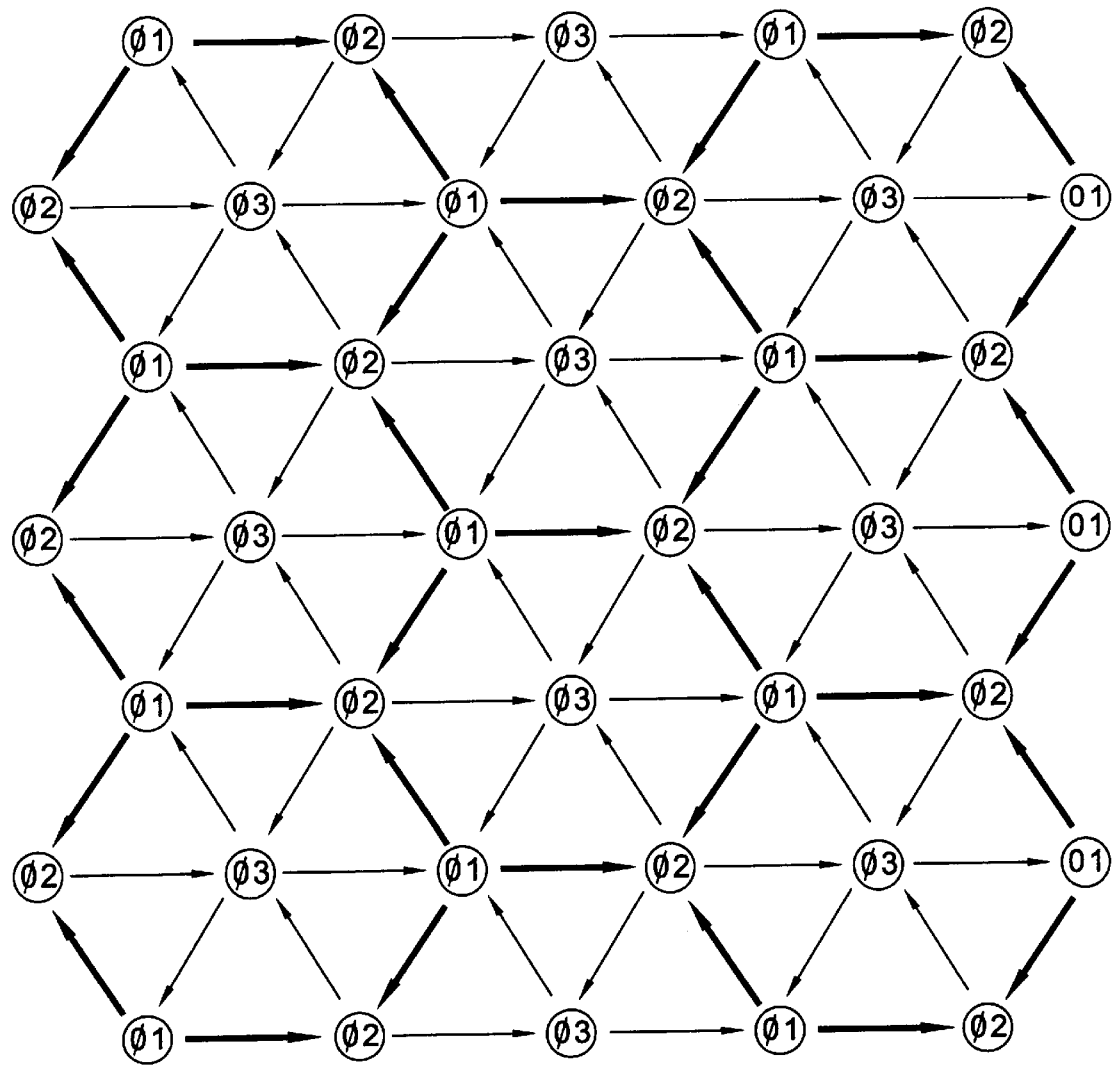
FIG. 5 is a symbolic diagram of a hexagonal network cooperative ring oscillator (CRO) according to the present invention.

Referring now to FIG. 5, a symbolic diagram of a preferred hexagonal network cooperative ring oscillator (CRO) according to the present invention, is illustrated. Here, the nodes are labeled according to output phase and the phase 1 clock signal ($\phi_1$) is highlighted in bold. Using array notation, the upper left node is illustrated as a phase one node ($\phi_1$) and each node is named with the phase it drives. Thus, multiple replications of a ring-oscillator containing three serially connected inverters may result in the formation of a two-dimensional hexagonal network of clock nodes of different phases (e.g., $\phi_1$, $\phi_2$ and $\phi_3$). Connection of the inverters as a hexagonal network also causes "aggregation" because the arrangement of the inverters in the net places the inverters in parallel. Whenever inverters are connected in parallel, an "aggregated" inverter is formed having an effective width equal to the arithmetic sum of the widths of all the individual inverters of the same phase. This "aggregation" compensates for process variations because the "faster" and "slower" inverters tend to cancel each other out during signal transitions and because transistor size variations are averaged. The benefits of aggregation are also independent of the size of the IC so efficient scaling can be readily achieved. Inverters of larger size (e.g., widths) can also be placed in close proximity to those portions of the circuit which have high load synchronous active devices therein, to inhibit local variations in skew and jitter. Finally, the above described embodiments of the invention may be applied to optical technologies containing optical integrated circuits and clock generators.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit, comprising:

a semiconductor substrate;

a plurality of active devices in said substrate, said plurality of active devices containing first, second and third groups of active devices therein;

a plurality of cooperatively coupled ring oscillators having respective first, second and third clock nodes therein, in said substrate; and means, on said substrate, for electrically interconnecting the first clock nodes together and the second clock nodes together and for electrically interconnecting the third clock nodes together and to at least one of the first, second and third groups of active devices.

2. The integrated circuit of claim 1, wherein said plurality of ring oscillators have the same number of stages.

3. The integrated circuit of claim 2, wherein at least one of said plurality of ring oscillators comprises a plurality of inverters.

4. The integrated circuit of claim 3, wherein said plurality of ring oscillators comprises a plurality of ring oscillators having the same number of stages, but different size.

5. The integrated circuit of claim 2, wherein said electrically interconnecting means comprises means for electrically connecting the first clock nodes to the first group of active device, the second clock nodes to the second group of active devices and the third clock nodes to the third group of active devices.

6. The integrated circuit of claim 4, wherein said electrically interconnecting means comprises means for electrically connecting the first clock nodes to the first group of active devices, the second clock nodes to the second group of active devices and the third clock nodes to the third group of active devices.

7. An integrated circuit, comprising:

a semiconductor substrate;

a plurality of asynchronous active devices in said substrate;

a plurality of synchronous active devices interspersed among said plurality of asynchronous active devices, in said substrate;

a plurality of ring oscillators of different size electrically coupled in parallel at their respective clock nodes and interspersed among said plurality of synchronous active devices, in said substrate; and means, on said substrate, for electrically interconnecting at least one of the clock nodes of said plurality of ring oscillators to said plurality of synchronous active devices.

8. The integrated circuit of claim 7, wherein said plurality of ring oscillators have the same number of stages.

9. The integrated circuit of claim 8, wherein at least one of said plurality of ring oscillators comprises a plurality of inverters.

10. A circuit, comprising:

a substrate;

a plurality of asynchronous active devices on said substrate;

a plurality of synchronous active devices on said substrate;

a plurality of ring oscillators electrically coupled in parallel at their respective clock nodes, on said substrate; and means, on said substrate, for electrically interconnecting at least one of the clock nodes of said plurality of ring oscillators to said synchronous active devices.

11. The circuit of claim 10, wherein said plurality of ring oscillators have the same number of stages.

12. The circuit of claim 11, wherein at least one of said plurality of ring oscillators comprises a plurality of inverters.

13. The circuit of claim 11, wherein said substrate comprises a printed circuit board.

* * * * *